United States Patent [19]

Sanders et al.

[11] Patent Number: 4,721,427

[45] Date of Patent: Jan. 26, 1988

[54] WAFER TRANSFER STAND

[75] Inventors: John D. Sanders, Orange; Jerry A. Taylor, Corona, both of Calif.

[73] Assignee: Thermco Systems, Inc., Orange, Calif.

[21] Appl. No.: 48,868

[22] Filed: May 12, 1987

[51] Int. Cl.[4] .............................................. B65G 65/30
[52] U.S. Cl. .................................. 414/417; 414/416; 211/41; 211/194
[58] Field of Search ............... 414/417, 411, 413, 416, 414/422, 424, 225; 211/194, 13, 41

[56] References Cited

U.S. PATENT DOCUMENTS

| | | | |
|---|---|---|---|
| 4,471,716 | 9/1984 | Milliren | 211/41 X |
| 4,490,087 | 12/1984 | Ryan et al. | 414/417 |
| 4,566,839 | 1/1986 | Butler | 414/417 X |
| 4,568,234 | 2/1986 | Lee et al. | 414/417 X |
| 4,569,624 | 2/1986 | Noda et al. | 414/225 |
| 4,611,966 | 9/1986 | Johnson | 414/417 X |
| 4,653,650 | 3/1987 | Schulke | 211/41 |
| 4,695,217 | 9/1987 | Lau | 414/417 X |

Primary Examiner—Robert J. Spar
Assistant Examiner—Vien Nguyen
Attorney, Agent, or Firm—John K. Williamson; James C. Valentine

[57] ABSTRACT

Empty wafer cassettes are stored on a transfer stand having one or more storage locations on a post which extends below a wafer comb while the wafers are being processed. Each storage location generally has a cross bar with spaced upward projections for receiving the leg of a cassette.

3 Claims, 4 Drawing Figures

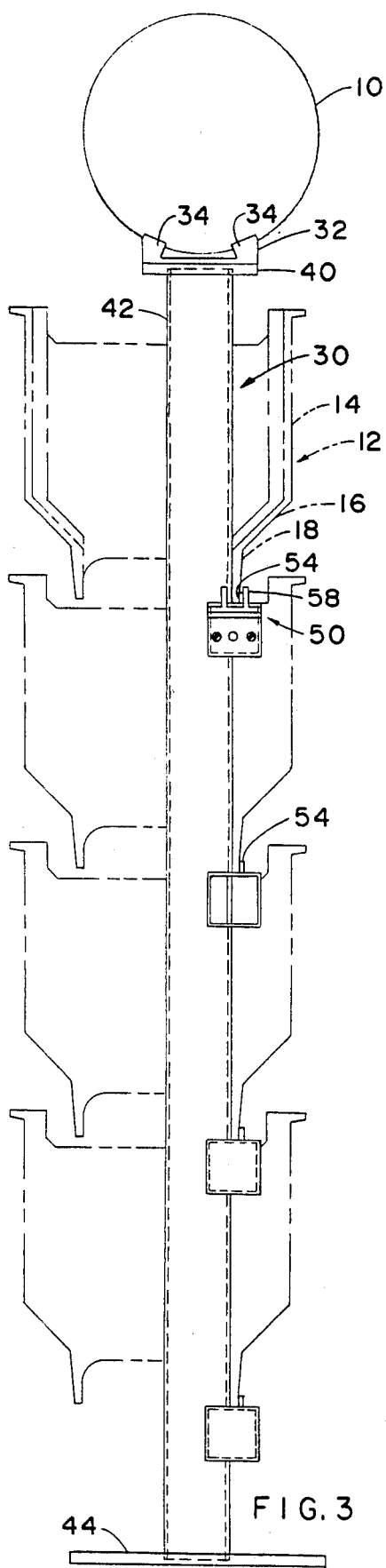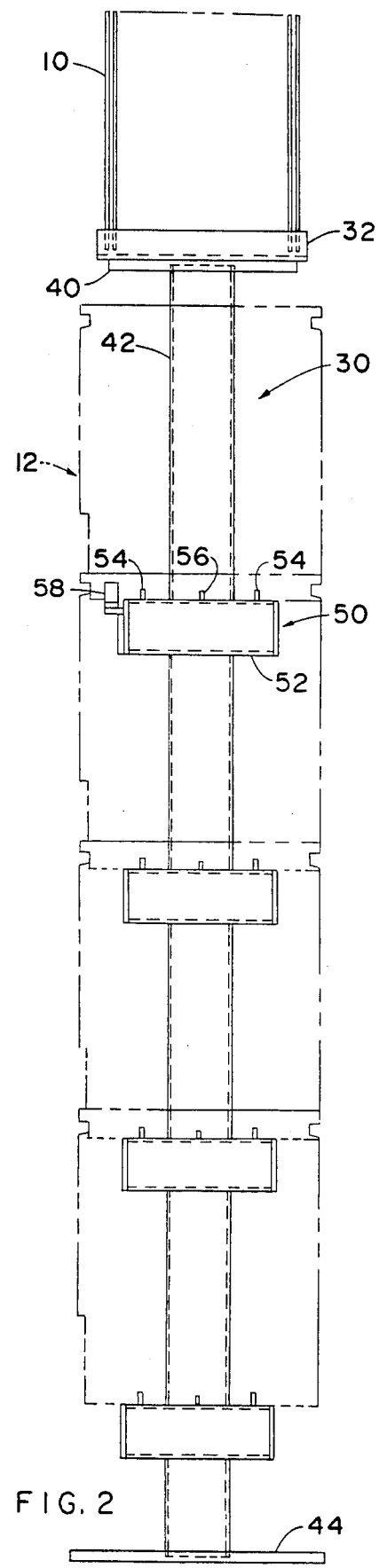

WAFER TRANSFER STAND

This invention relates to a wafer transfer stand for transferring semiconductor wafers to and from cassettes to intermediate apparatus for eventual transfer to a processing step. Semiconductor wafers routinely are transported about wafer fabrication areas in bottomless plastic cassettes which typically contain 25 spaced apart wafers. When the wafers must be processed in hostile environments such as high temperature CVD furnaces, the wafers must be transferred to other carriers such as quartz boats in the case of CVD furnaces. After processing, the wafers are then returned to the cassettes. Preferably, the wafers are carried in the same cassettes throughout the fabrication process in order to reduce the possibilities of cross-contamination.

Horizontal CVD furnaces frequently include stacks of two to four processing tubes and the processing tubes treat up to about 100 or more wafers at a time. Thus, about 16 25-wafer cassettes are involved if a stack of four processing tubes is operating at maximum capacity. More would be involved in highly automated systems. Also, there are frequently several CVD furnaces in one wafer fabrication facility. Obviously, these cassettes require a considerable amount of handling.

In the operation of a CVD furnace, a bottomless wafer ladened cassette is taken from a "flat finder" and then lowered over an upwardly facing wafer "comb" having a series of grooves for receiving the wafers in the cassette as the cassette is lowered to a stand below. Alternatively, the comb may be raised from under the cassette to lift the wafers from the cassette on a stand. In both cases, a transfer mechanism removes the wafers from the comb to quartz boats located on a boat loader and the empty cassettes are removed to a nearby storage means such as a shelved structure. If 100 wafers were to be processed, four 25-wafer cassettes would be unloaded and then transferred to storage. After processing, the cassettes would in turn be returned to the comb from storage and loaded with wafers replaced on the comb by the transfer mechanism in an intervening step.

The wafer transfer stand of the present invention greatly simplifies the handling of the empty cassettes. In addition, the stand permits the cassettes to be compactly stored on site without substantially increasing the required floor space. After processing, the empty cassettes are returned to the comb in reverse order so that the wafers may be returned to the same cassette. The improved wafer stand has an upwardly facing comb for receiving wafers from cassettes as they are lowered over the comb. A post having at least one cassette support means extends downwardly from the comb. When the empty cassette has been lowered below the comb, it is then supportedly stored on the post. Preferably, the post has storage locations for all of the cassettes which are required to load a process tube. Thus, for example, a stand for use with a processing tube which handles 100 wafers would have four storage locations for storing four 25-wafer cassettes. The first cassette would be stored at the bottommost location of the post and the fourth cassette would be stored at the topmost location. Thus, there is no lost time in transporting empty carriers serially between the comb and nearby storage locations, there is a minimum headroom and floor space requirement as the empty cassettes can be tightly stacked below the comb, and the cassettes are always returned to the comb in reverse order with the correct front to back orientation.

Other details, objects and advantages of the invention will become apparent as the following description of a present preferred embodiment thereof proceeds.

In the accompanying drawings, a present preferred embodiment of the invention is shown, in which:

FIG. 2 is a front elevational view of a wafer stand of the present invention;

FIG. 3 is a side view of the wafer stand of FIG. 1; and

Figure 1:
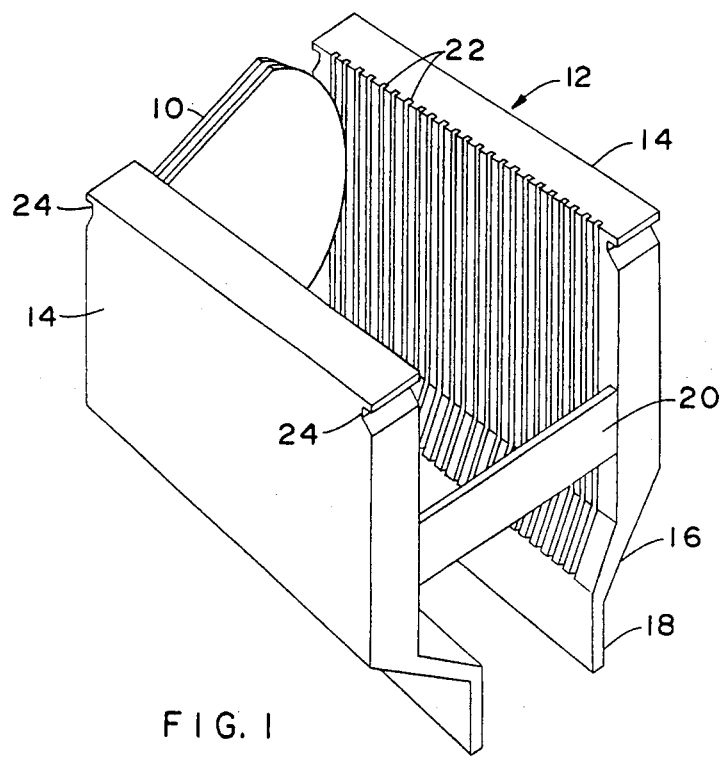
FIG. 1 is a perspective view of a conventional cassette.

A conventional commercially available bottomless cassette 12 for carrying wafers 10 is shown in FIG. 1. The body of the cassette comprises two grooved sides 14 with inwardly sloping bottom portions 16 and leg portions 18 maintained in spaced relationship by two sides 20. Up to about 25 wafers are carried in the grooves 22 and the cassettes are transported by a fork (not shown) whose prongs are received in notches 24. Alternative suitable cassettes and end effectors may be used.

One of the leg portions 18 has a key way (not shown) in its bottom edge for receiving a locating key when placed by automated equipment to assure proper nesting.

Figure 4:
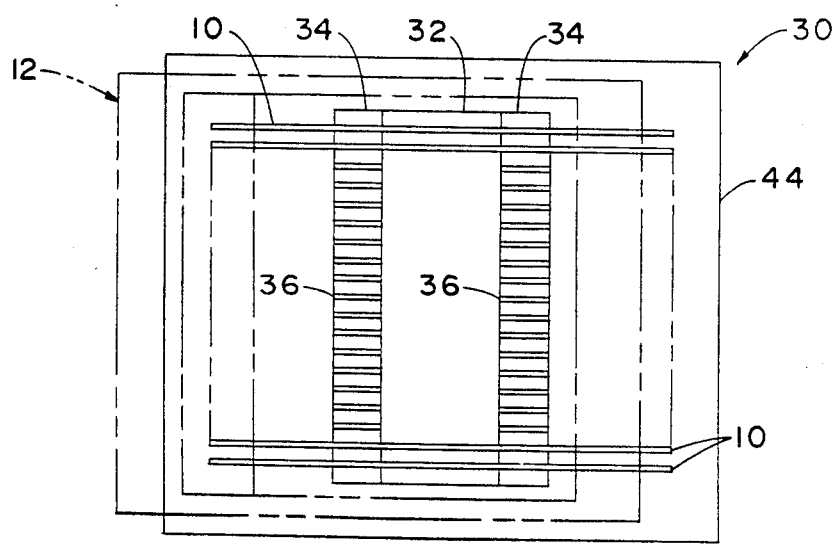
FIG. 4 is a top view of the wafer stand of FIG. 1.

The wafer transfer stand 30 shown in FIGS. 2-4 (with cassettes 12 shown as phantom figures) generally comprises comb 32 which has two spaced apart upwardly extending projections 34 having grooves 36 for receiving the wafers 10 from a cassette 12 as it is lowered over the comb 32. The comb is supported by a plate 40 which is mounted on the top end of a post 42 which extends down to a base plate 44 mounted on the bottom end of the post 42. The post 42 may be rectangular metal tubing or any other suitable material or shape.

The post 42 shown has four identical support means 50 for supportably engaging cassette 12 after they have been lowered below the comb 32. Each support means 50 comprises a cross member 52 (which may also be fabricated from rectangular tubing or other suitable material) which has at least one and preferably two upwardly extending projections such as pins 54 in spaced apart relation from the post 42 in order that the leg portion 18 of the side 14 of the cassette 12 may be located on the cross member 52. A locating key 56 for engaging a key way (not shown) in one leg portion 18 of a cassette 12 is disposed between the pins 54 and between the post 42 and the pins 54 for positioning the cassette 12 with the proper front to back alignment. The presence of a cassette on the cross member 52 is detected by an optical sensor 58 mounted on one end of the cross member 52. A second sensor (not shown) may also be used to detect an out-of-position cassette. As is suggested by the drawings, the support means 50 must be compact enough to permit the cassettes 12 to be lowered over them. Also, the support means 50 can be spaced from each other less than the height of a cassette 12 because the leg portions 18 of the sides 14 extend from the interior portion 16 of the sides. It is undesirable however to have the leg 18 of one cassette 12 touch the interior portion of the cassette 12 below as this introduces a possible source of contamination.

In a routine process, the first of four wafer ladened cassettes 12 would be lowered by, e.g., a "robot", over the stand 30 to transfer the wafers 10 to the comb 32. The cassette would be lowered to the bottommost support means 50 and then moved horizontally until the leg portion 18 of the cassette 12 was aligned with the post 42 and upwardly projecting pins 54. The cassette 12 would be lowered to a position where the locating key 56 was received by the key way in the cassette leg 18 and the leg 18 was resting on the cross member 52. The optical sensor 58 would detect the proper nesting of the carrier and the robot would then proceed to bring the next cassette (after the wafers 10 on the comb had been transferred to the quartz boats). After processing, the last loaded 25 wafers would be returned to the comb 32 and the robot would remove the uppermost cassette 12 from the top support means 50, properly align the cassette 12 below the comb 32 and then raise the cassette 12 until the wafers 10 were supported in the cassettes 12 and transport the wafer ladened cassettes 12 to an output station. The next three cassettes would then be loaded and transported to the output station. The next batch of wafers could then be loaded into the waiting boats.

While a present preferred embodiment of the invention has been shown and described, it is to be distinctly understood that the invention is not limited thereto but may be otherwise variously embodied within the scope of the following claims.

What is claimed is:

1. A wafer transfer stand for transferring closely spaced semiconductor wafers from a bottomless cassette having a side member, comprising:
    an upwardly facing comb for receiving the wafers from the cassette;
    a post extending downwardly from the comb;
    a cassette support, means mounted to the post below the said comb for supportably engaging the side member of the cassette whereby the cassette may be lowered over the comb to transfer the wafers from the cassette and the empty cassette may be stored on the support means below said comb.

2. The wafer transfer stand of claim 1 wherein the post has a plurality of support members for supporting more than one cassette.

3. The wafer transfer stand of claim 1 wherein the support member comprises a horizontally extending cross member mounted to the post and at least one projection extending upwardly from the cross member in spaced apart relation from the post for receiving the side member of the cassette.

* * * * *